(12) United States Patent
Phan (10) Patent No.: US 9,583,918 B1
(45) Date of Patent: Feb. 28, 2017

(54) METHOD AND SYSTEM FOR POWERING MULTIPLE COMPUTER PLATFORMS IN SYMMETRIC CONFIGURATION

(75) Inventor: Manhtien Phan, Morgan Hill, CA (US)

(73) Assignee: SUPER MICRO COMPUTER, INC., San Jose, CA (US)

( * ) Notice: Subject to any disclaimer, the term of this patent is extended or adjusted under 35 U.S.C. 154(b) by 0 days.

(21) Appl. No.: 12/870,831

(22) Filed: Aug. 29, 2010

Related U.S. Application Data (63) Continuation-in-part of application No. 11/548,694, filed on Oct. 11, 2006, now Pat. No. 7,813,146.

(60) Provisional application No. 60/826,935, filed on Sep. 26, 2006.

(51) Int. Cl.
  *H02B 1/20* (2006.01)
  *H04Q 1/14* (2006.01)
  *H04Q 1/06* (2006.01)
  *H05K 3/42* (2006.01)

(52) U.S. Cl.
  CPC ............ *H02B 1/202* (2013.01); *H04Q 1/06* (2013.01); *H04Q 1/14* (2013.01); *H05K 3/429* (2013.01)

(58) Field of Classification Search
  CPC . H02B 1/202; H04Q 1/14; H04Q 1/06; H05K 3/429; H01L 2924/01079; H01L 2924/01078; H01L 2224/16
  USPC .............. 361/748, 760, 792, 794, 741
  See application file for complete search history.

(56) References Cited

U.S. PATENT DOCUMENTS

| | | | |
|---|---|---|---|
| 6,548,986 B1* | 4/2003 | Jakubowski | 320/111 |
| 7,212,420 B2* | 5/2007 | Liao | 363/146 |
| 7,279,634 B1* | 10/2007 | Chang | 174/50.5 |
| 7,316,586 B2* | 1/2008 | Anderson et al. | 439/638 |
| 7,573,159 B1* | 8/2009 | Deluliis et al. | 307/150 |
| 2005/0276023 A1* | 12/2005 | Zansky et al. | 361/731 |

* cited by examiner

*Primary Examiner* — Hung S Bui
(74) *Attorney, Agent, or Firm* — Artegis Law Group, LLP (57) ABSTRACT

Techniques pertaining to powering multiple platforms with a minimum impact on air passage in a predefined environment are disclosed. Instead of connecting each of the platforms in a chassis to a power supply therein, the present invention uses what is referred to as cascading powering to power all platforms within minimum cable delivery. According to one embodiment of the present invention, a power supply is disposed between two groups of platforms and powers them at the same time. At least one of the platforms has a power connector located towards or near the power supply so that only a short cable is needed to power the platform.

19 Claims, 7 Drawing Sheets

METHOD AND SYSTEM FOR POWERING MULTIPLE COMPUTER PLATFORMS IN SYMMETRIC CONFIGURATION

CROSS-REFERENCE TO RELATED APPLICATION

This application is a continuation-in part of U.S. application Ser. No. 11/548,694, filed Oct. 11, 2006 entitled "Method and system for powering multiple computer platforms", now U.S. Pat. No. 7,813,146, which claims the benefits of the provisional application No. 60/826,935, entitled "Method and system for powering multiple computer platforms", filed Sep. 26, 2006, which is hereby incorporated by reference for all purposes.

BACKGROUND OF THE INVENTION

Field of the Invention

The present invention generally relates to the area of powering computing systems, and more particularly, relates to techniques for powering multiple computer platforms or boards in a predefined housing with a minimum impact on the air passage therein.

Description of the Related Art

Figure 1:
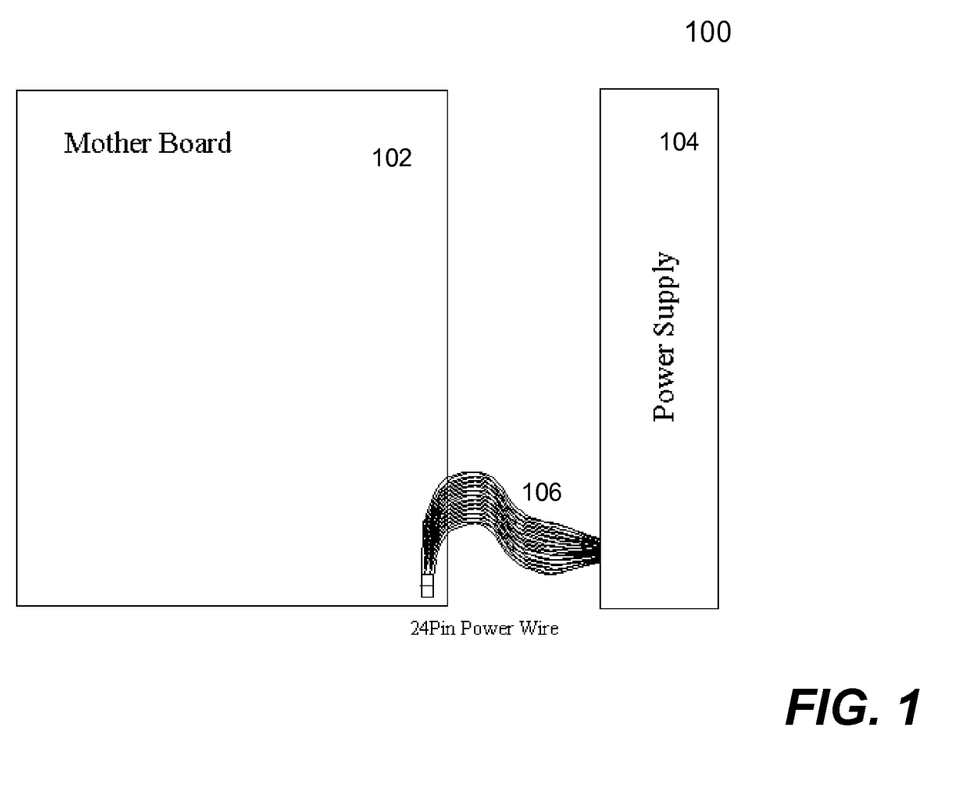
FIG. 1 shows an exemplary way commonly used to power a single platform in a chassis.

Mountable chassis are often used to house computer boards. Each chassis functions independently and therefore includes at least one platform or board and one power supply. FIG. 1 shows an exemplary way commonly used to power a single platform 102 in a chassis 100. The platform 102 is powered by a power supply 104 through a multiple-pin cable 106. As shown in FIG. 1, a connector for receiving the cable 106 on the platform 102 is often located near the power supply 104 so that the cable delivery (e.g., the cable length) is short.

The Industry standard of power delivery uses one or more ATX or extended ATX power supplies with a 20 or 24 pin cable to power a single computer platform. In one standard, a 20-pin and a 24-pin cable are defined respectively as follows:

| (Supermicro defined) Standard 20-pin definition: | |
|---|---|
| Pin | Definition |
| 1 | no connected |
| 2 | no connected |
| 3 | GROUND |
| 4 | GROUND |
| 5 | GROUND |
| 6 | GROUND |
| 7 | 12V |
| 8 | 12V |
| 9 | 12V |
| 10 | 12V |
| 11 | PSON# |
| 12 | 5V STBY |
| 13 | GROUND |
| 14 | GROUND |
| 15 | GROUND |
| 16 | GROUND |
| 17 | 12V |
| 18 | 12V |
| 19 | 12V |
| 20 | 12V |

| (Industrial defined) Standard 24/20-pin definition: | |
|---|---|
| Pin | Definition |
| 1 | 3.3V |
| 2 | 3.3V |
| 3 | GROUND |
| 4 | 5V |
| 5 | GROUND |
| 6 | 5V |
| 7 | GROUND |
| 8 | POWER GOOD |
| 9 | 5V STANDBY |
| 10 | 12V |
| 11 | 12V |
| 12 | 3.3V |
| 13 | 3.3V |
| 14 | −12V |
| 15 | GROUND |
| 16 | PSON# |
| 17 | GROUND |
| 18 | GROUND |
| 19 | GROUND |
| 20 | −5 |
| 21 | 5V |
| 22 | 5V |
| 23 | 5V |
| 24 | GROUND |

Figure 2:
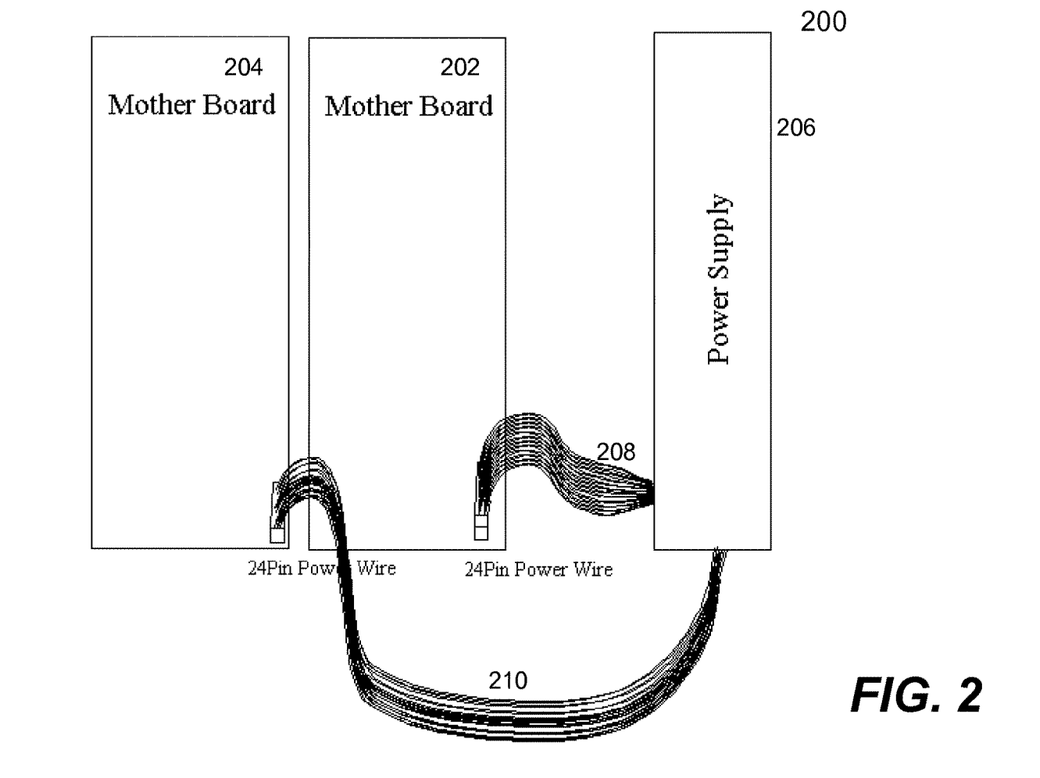
FIG. 2 shows an exemplary way commonly used to power two individual platforms in a chassis.

When there is a need to have multiple platforms in a chassis, a traditional way is to have the power supply in the chassis to power these platforms in parallel. FIG. 2 shows one exemplary way commonly used to power two individual platforms 202 and 204 housed in a chassis 200. Both platforms 202 and 204 are powered by a power supply 206 via two separate cables 208 and 210. It may be appreciated that as the number of the platforms increases, the cable delivery from the power supply to the platforms increases, a large amount of cabling in a chassis may subsequently block cooling air passage or at least narrow down the already squeezed cooling air passage in the chassis.

There is, therefore, a need for improved techniques that power multiple platforms with a minimum impact on the air passage in a predefined environment (e.g., a chassis).

SUMMARY

This section is for the purpose of summarizing some aspects of embodiments of the present invention and to briefly introduce some preferred embodiments. Simplifications or omissions in this section as well as the title and the abstract of this disclosure may be made to avoid obscuring the purpose of the section, the title and the abstract. Such simplifications or omissions are not intended to limit the scope of the present invention.

Broadly speaking, the present invention pertains to method and system for powering multiple platforms with a minimum impact on air passage in a predefined environment, such as a chassis. Instead of connecting each of the platforms in a chassis to a power supply therein, the present invention uses what is referred to as cascading powering to power all platforms within minimum cable delivery. According to one aspect of the present invention, each platform is provided with a pair of power connectors. At least one of the platforms has a power connector located towards or near a power supply so that only a short multi-pin cable is needed to power the platform. The power is provided to an adjacent platform via a pair of corresponding connectors in cascading fashion, each located on one of the two adjacent platforms. Thus only a small cable is needed to connect the two connectors. Such configuration is extended to the remaining platforms. As a result, all platforms are cascaded and powered by the same power supply without using individual cables directly to the power supply.

According to another aspect of the present invention, a redundant or secondary power supply is provided. By using the similar configuration to deliver the connection from all platforms to the secondary power supply, possible interruption due to the failure of the primary power supply could be minimized. At the same time, the cable delivery for the second power supply is also minimized.

According to still another aspect of the present invention, the power supply is centrally disposed so that the platforms are nearly equally distributed on both sides of the power supply. With the similar concept, the power supply powers two adjacent platforms at the same time, each of the platforms continues to power its own connected platforms. Depending on implementation, the power supply may be supplemented with one or more backup power suppliers or a power distribution mechanism to equally power the two adjacent platforms on both sides thereof.

The present invention may be implemented as a method and a system. According to one embodiment, the present invention is a method for power multiple platforms, the method comprises coupling a first one and a second one of the platforms, respectively, to a power supply, wherein the first platform and the second platform are physically closest to the power supply, and each of the first platform and the second platform is disposed on one side of the power supply, and wherein a first connection between the first platform and the power supply is made by a first short cable including multiple voltages, and a second connection between the second platform and the power supply is made by a short second cable including multiple voltages, thus minimizing wiring delivery so as to reduce blockage of air passage in the enclosed environment.

According to another embodiment, the present invention is a system for powering for powering multiple platforms, the system comprises a first platform and a second platform; a power supply disposed between the first and second platforms, and wherein the first platform and the second platform are physically closest to the power supply, a first connection between the first platform and the power supply is made by a first short cable including multiple voltages, and a second connection between the second platform and the power supply is made by a short second cable including multiple voltages, thus wiring delivery is minimized so as to reduce blockage of air passage.

Depending on implementation, the system may be a chassis and further include a backup power supply to minimize possible interruption of the system due to the failure of the power supply. Thus all of the platforms are serially cascaded to the backup power supply.

Accordingly one of the objects of the present inventions is to provide improved techniques of powering multiple platforms in a predefined environment.

Other objects, features, and advantages of the present invention will become apparent upon examining the following detailed description of an embodiment thereof, taken in conjunction with the attached drawings.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF THE PREFERRED EMBODIMENTS

The detailed description of the invention is presented largely in terms of procedures in terms of procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth in order to provide a thorough understanding of the present invention. However, it will become obvious to those skilled in the art that the present invention may be practiced without these specific details. In other instances, well known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Figure 3:
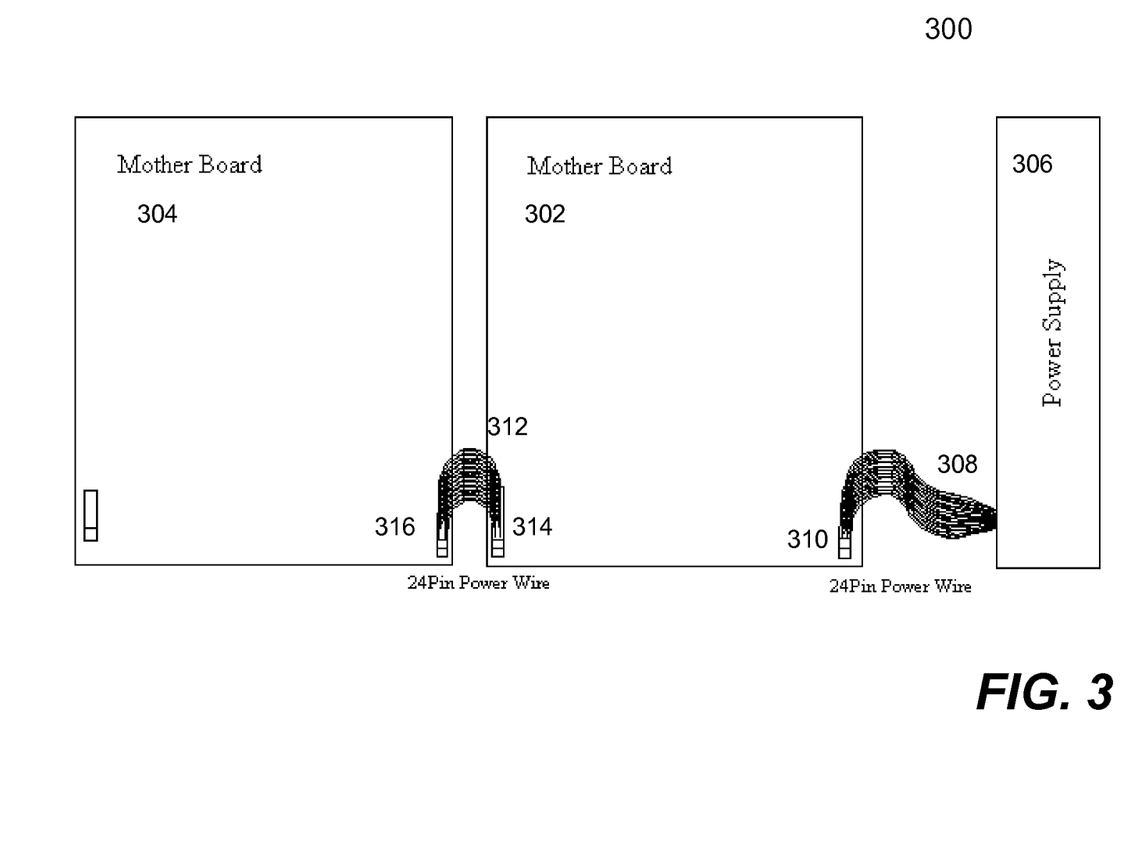
FIG. 3 shows an exemplary block diagram of powering two individual platforms according to one embodiment of the present invention.

Referring now to the drawings, in which like numerals refer to like parts throughout the several views. According to one embodiment of the present invention, FIG. 3 shows an exemplary block diagram of powering two individual mother boards 302 and 304. The first mother board 302 is powered directly by a 24-pin power cable from the power supply 306. The first mother board 302 is configured to include a pair of power connectors 310 and 314. As illustrated in the figure, the power connector 310 is used to be connected to the power supply 306. The first mother board 302 then passes the power and any control signals, if there are any, to the second mother board 304 via the connectors 314 and 316. Because the two corresponding connectors 314 and 316 are physically near to each other, the cable 312 connecting them shall be of small or short. Similarly, the cable 308 shall be of small or short.

In other words, when there are a number of computing platforms, these platforms are cascaded to be powered by a single power supply so as to reduce the wiring or cable delivery. Such cascading powering can reduce wiring of power delivery to multiple platforms in rack mountable chassis of 1U, 2U and up. Consequently, the cascading powering reduces the use of a lot of wires that otherwise would block (cooling) air passage in a predefined environment (e.g., a chassis).

Figure 4:
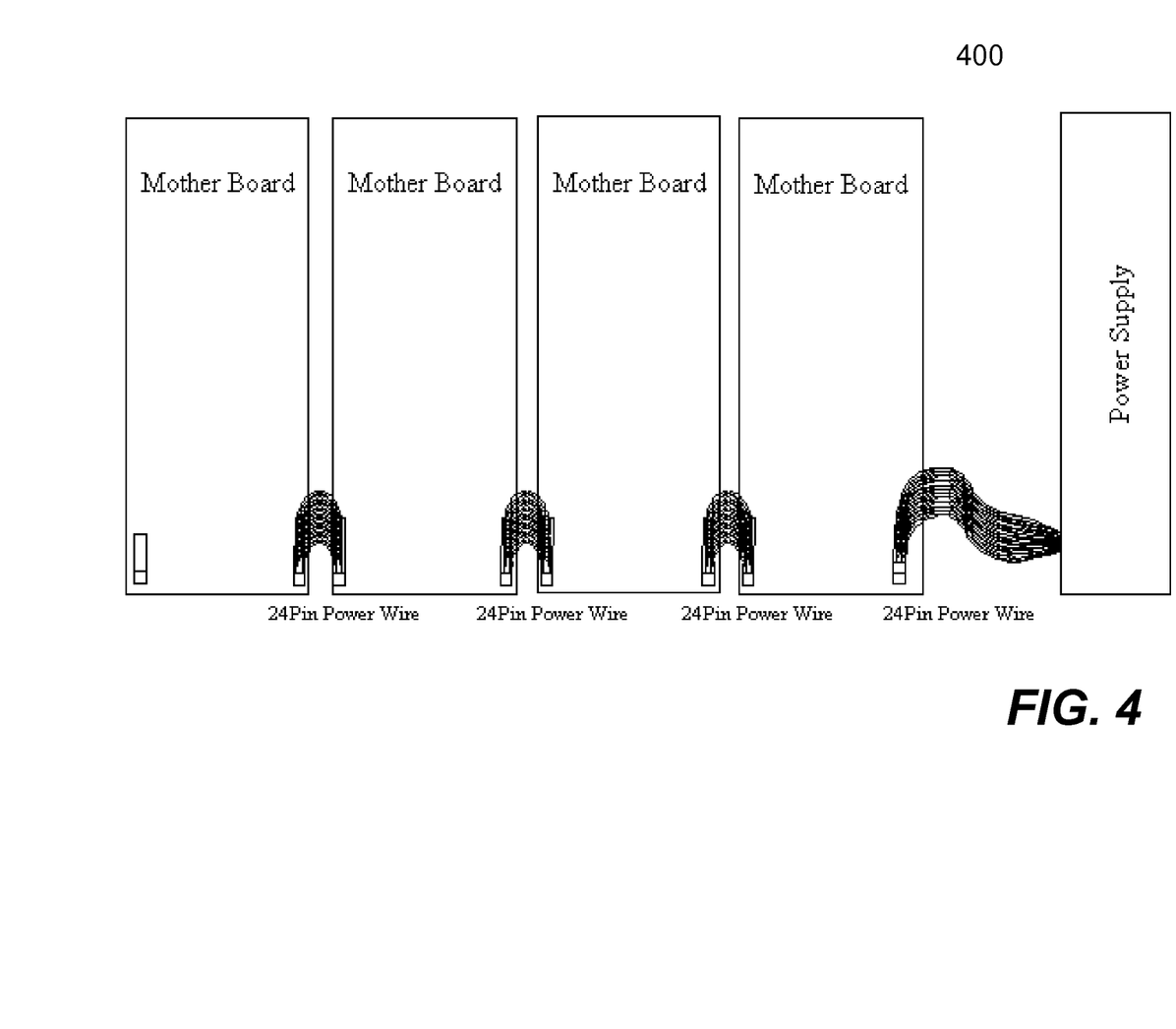
FIG. 4 shows a configuration of powering a number of computer boards by cascading.

FIG. 4 shows a configuration 400 of powering a number of boards by cascading. Because the wiring delivery happens only between two adjacent boards, the wiring itself would not significantly effect the air passage in a chassis. It can be appreciated that the cascading powering can be extended to many boards as long as the power supply is sufficient in power.

Figure 5:
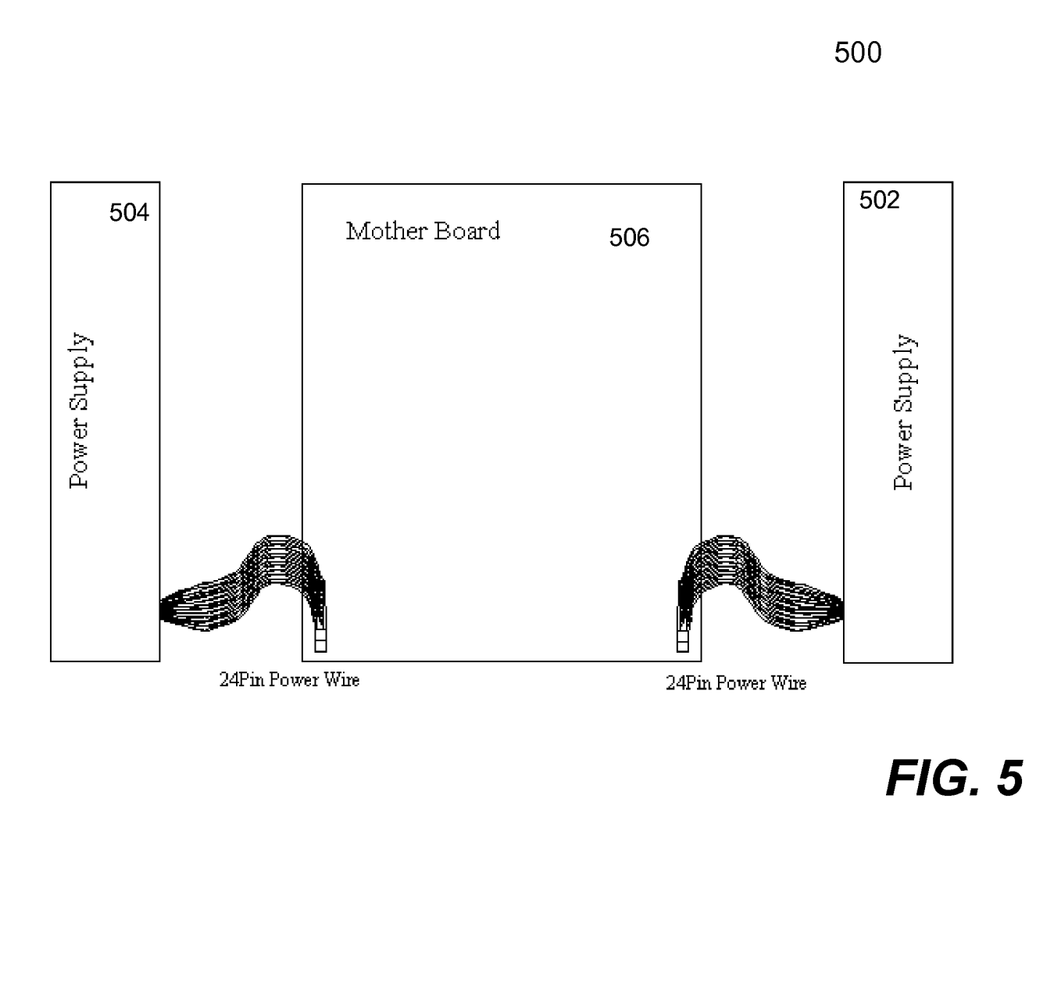
FIG. 5 shows a configuration of providing a backup power supply, such configuration being readily extended to one embodiment of the present invention, in which all platforms may be serially cascaded to be coupled to the backup power supply.

For redundant purpose of power supplies, according to one embodiment, a secondary or backup power supply is provided. Thus one platform may use two identical power connectors with two power supplies or either one of them. FIG. 5 shows a configuration 500 of providing two power supplies 502 and 504 to a mother board 506. In one embodiment, one of the two power supplies 502 and 504 is primary the other one is a secondary or backup. In the event that the primary one fails, the second one can be figured to automatically step in to continue the power supply.

To use the configuration illustrated in FIG. 5, in one embodiment, each of the platforms to be powered is equipped with two identical power connectors, each for being cascaded for one power supply to ensure the redundancy.

Figure 6:
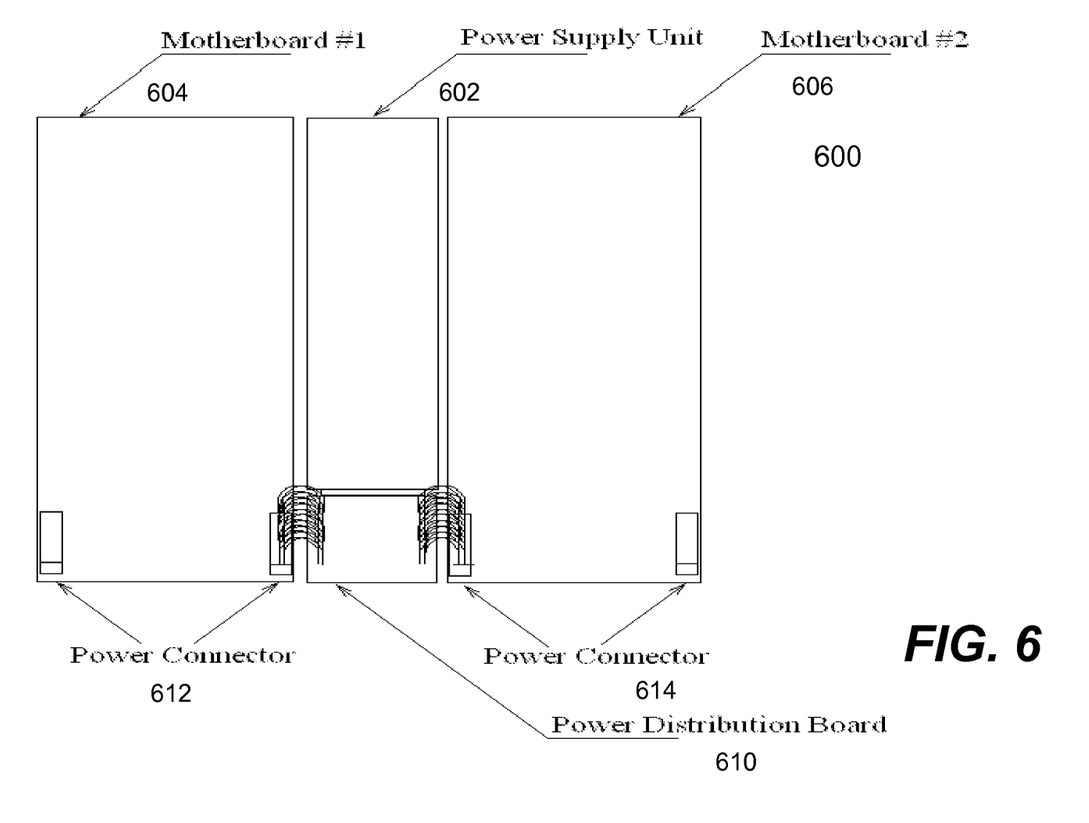
FIG. 6 shows an exemplary block diagram of a power supply centrally located or between two platforms.

FIG. 6 shows an exemplary block diagram of a power supply 602 centrally located. It is a symmetric configuration with reference to the power supply 602 that is provided to power two individual mother boards 604 and 606. Each of the mother boards 604 and 606 is disposed on one side of the power supply 602 and both of the mother boards 604 and 606 are powered at the same time.

Accordingly to one embodiment, the power supply 602 includes a distribution board 610 provided to distribute the power equally to both sides thereof. The power supply 602 may supply multiple levels of voltage and be redistributed by the distribution board 610. A 24-pin power cable is used to power one of the boards 604 and 606.

Figure 7:
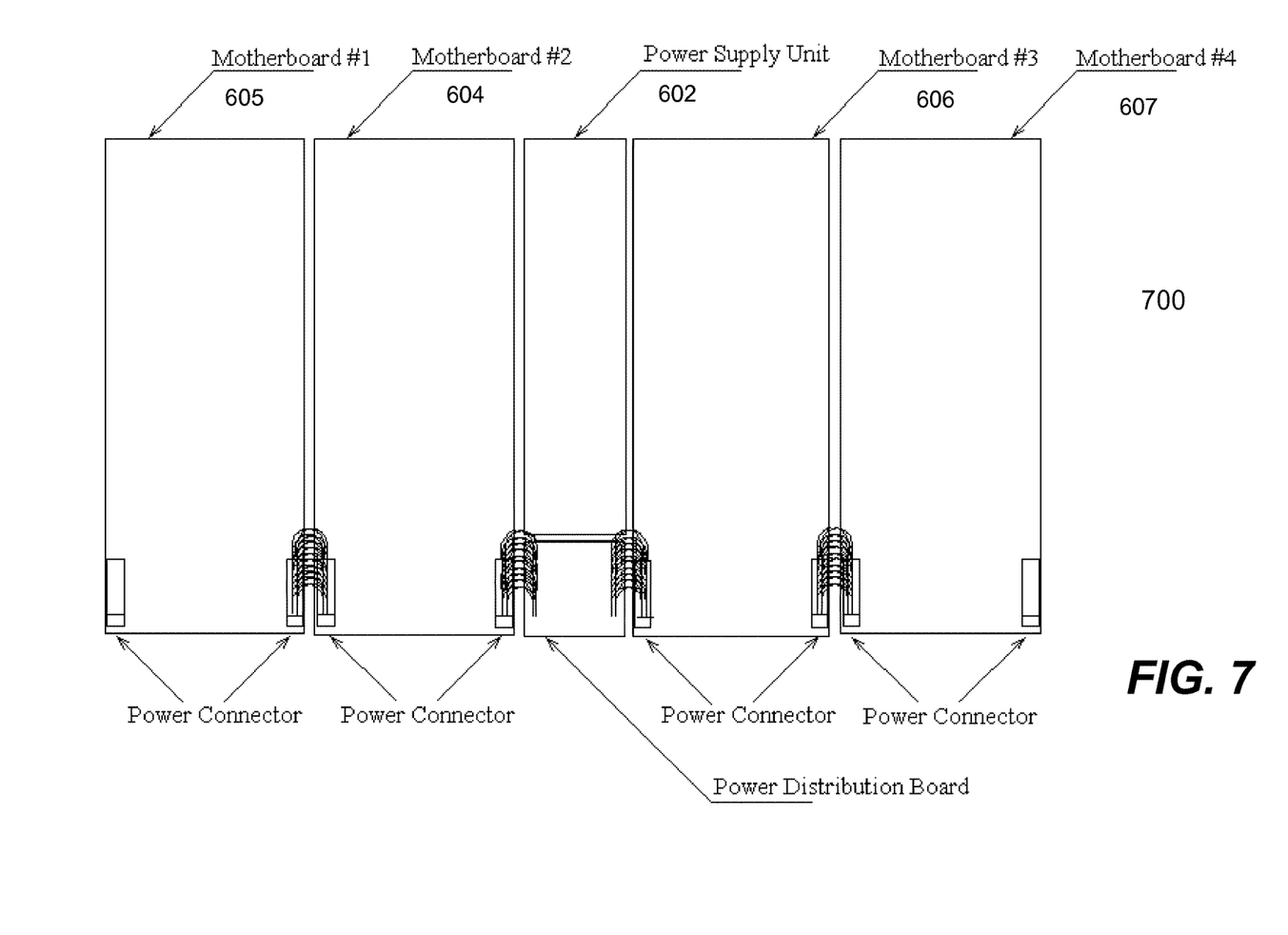
FIG. 7 shows a power supply centrally located powering multiple platforms on one side.

Accordingly to one embodiment, each of the mother board 604 and 606 is configured to include a pair of power connectors 612 and 614. As illustrated in the figure, one of the power connectors 612 is used to be connected to the power supply 602 or distribution board 610. The mother board 604 then passes the power and any control signals, if there are any, to a second mother board 605 via the connectors 612 and 613 as shown in FIG. 7. Because the two corresponding connectors 612 and 613 are physically near to each other, the cable from the mother board 604 to the mother board 605 can be of small or short. Similarly, the cable from the mother board 606 to the mother board 607 can be of small or short. As a result, these cables would not block the passage of ventilation within a device (e.g., a blade server) having multiple mother boards.

One of the features in the present invention is to power multiple platforms with minimized wiring delivery so as to reduce the blockage of air passage. The foregoing description of embodiments is illustrative of various aspects/embodiments of the present invention. Various modifications to the present invention can be made to the preferred embodiments by those skilled in the art without departing from the true spirit and scope of the invention as defined by the appended claims. Accordingly, the scope of the present invention is defined by the appended claims rather than the foregoing description of embodiments.

I claim:

1. A method for powering multiple mother boards in an enclosed computing environment, the method comprising:
   connecting a first short cable to a power distribution board included in a power supply unit and to a first mother board to couple the first mother board immediately adjacent to a first side of the power supply unit, wherein the first short cable is configured to transfer power at different voltage levels as well as control signals from the power supply unit to the first mother board; and
   connecting a second short cable to the power distribution board and to a second mother board to couple the second mother board immediately adjacent to a second side of the power supply unit that is opposite to the first side of the power supply unit, and wherein the second short cable is configured to transfer power at different voltage levels as well as control signals from the power supply unit to the second mother board.

2. The method as recited in claim 1, wherein the first mother board includes a first connector to which the first short cable is connected, and the second mother board includes a first connector to which the second short cable is connected, wherein the first connector included on the first mother board is disposed on a first side of the first mother board that is proximate to the first side of the power supply unit, and the first connector included on the second mother board is disposed on a first side of the second mother board that is proximate to the second side of the power supply unit, and wherein the first connector included on the first mother board and the first connector included on the second mother board are substantially aligned with one another.

3. The method as recited in claim 2, further comprising:
   connecting a third short cable to the first mother board and to a third mother board to couple the third mother board immediately adjacent to a second side of the first mother board that is opposite to the first side of the first mother board, and wherein the third short cable is configured to transfer power at different voltage levels as well as control signals from the first mother board to the third mother board.

4. The method as recited in claim 3, further comprising:
   connecting a fourth short cable to the second mother board and to a fourth mother board to couple the fourth mother board immediately adjacent to a second side of the second mother board that is opposite to the first side of the second mother board, and wherein the fourth short cable is configured to transfer power at different voltage levels as well as control signals from the second mother board to the fourth mother board.

5. The method of claim 4, wherein:
   the first mother board includes a second connector to which the third short cable is connected, and the third mother board includes a first connector to which the third short cable is connected, wherein the second connector included on the first mother board is disposed on the second side of the first mother board, and the first connector included on the third mother board is disposed on a first side of the third mother board that is proximate to the second side of the first mother board, and wherein the second connector included on the first mother board and the first connector included on the third mother board are substantially aligned with one another, and
   the second mother board includes a second connector to which the fourth short cable is connected, and the fourth mother board includes a first connector to which the fourth short cable is connected, wherein the second connector included on the second mother board is disposed on the second side of the second mother board, and the first connector included on the fourth mother board is disposed on a first side of the fourth mother board that is proximate to the second side of the second mother board, and wherein the second connector included on the second mother board and the first connector included on the fourth mother board are substantially aligned with one another.

6. The method of claim 3, wherein the first mother board includes a second connector to which the third short cable is connected, and the third mother board includes a first connector to which the third short cable is connected, wherein the second connector included on the first mother board is disposed on the second side of the first mother board, and the first connector included on the third mother board is disposed on a first side of the third mother board that is proximate to the second side of the first mother board, and wherein the second connector included on the first mother board and the first connector included on the third mother board are substantially aligned with one another.

7. The method as recited in claim 1, wherein the power distribution board included in the power supply unit is configured to distribute power substantially equally between the first mother board and the second mother board.

8. The method as recited in claim 7, further comprising connecting a backup power supply to the power distribution board, wherein the power distribution board is configured to distribute power from the backup power supply to the first mother board and to the second mother board when the power supply unit stops working.

9. The method as recited in claim 1, wherein the enclosed computing environment comprises a chassis.

10. An enclosed computing system for powering multiple mother boards, the system comprising:
a power supply unit that includes a power distribution board;
a first mother board that is connected the power distribution board via a first short cable, wherein the first mother board is disposed immediately adjacent to a first side of the power supply unit, and wherein the first short cable is configured to transfer power at different voltage levels as well as control signals from the power supply unit to the first mother board; and
a second mother board that is connected to the power distribution board via a second short cable, wherein the second mother board is disposed immediately adjacent to a second side of the power supply unit that is opposite to the first side of the power supply unit, and wherein the second short cable is configured to transfer power at different voltage levels as well as control signals from the power supply unit to the second mother board.

11. The system as recited in claim 10, further comprising:
a first connector included on the first mother board and to which the first short cable is connected; and
a first connector included on the second mother board and to which the second short cable is connected,
wherein the first connector included on the first mother board is disposed on a first side of the first mother board that is proximate to the first side of the power supply unit, and the first connector included on the second mother board is disposed on a first side of the second mother board that is proximate to the second side of the power supply unit, and wherein the first connector included on the first mother board and the first connector included on the second mother board are substantially aligned with one another.

12. The system as recited in claim 11, further comprising:
a third mother board that that is connected to the first mother board via a third short cable, wherein the third mother board is disposed immediately adjacent to a second side of the first mother board that is opposite to the first side of the first mother board, and wherein the third short cable is configured to transfer power at different voltage levels as well as control signals from the first mother board to the third mother board.

13. The system of claim 12, further comprising:
a second connector included on the first mother board and to which a third short cable is connected; and
a first connector included on the third mother board and to which the third short cable is connected,
wherein the second connector included on the first mother board is disposed on the second side of the first mother board, and the first connector included on the third mother board is disposed on a first side of the third mother board that is proximate to the second side of the first mother board, and wherein the second connector included on the first mother board and the first connector included on the third mother board are substantially aligned with one another.

14. The system as recited in claim 11, further comprising:
a fourth mother board that that is connected to the second mother board via a fourth short cable, wherein the fourth mother board is disposed immediately adjacent to a second side of the second mother board that is opposite to the first side of the second mother board, and wherein the fourth short cable is configured to transfer power at different voltage levels as well as control signals from the second mother board to the fourth mother board.

15. The system of claim 14, further comprising:
a second connector included on the first mother board and to which a third short cable is connected;
a first connector included on the third mother board and to which the third short cable is connected,
wherein the second connector included on the first mother board is disposed on the second side of the first mother board, and the first connector included on the third mother board is disposed on a first side of the third mother board that is proximate to the second side of the first mother board, and wherein the second connector included on the first mother board and the first connector included on the third mother board are substantially aligned with one another;
a second connector included on the second mother board and to which a fourth short cable is connected; and
a first connector included on the fourth mother board and to which the fourth short cable is connected,
wherein the second connector included on the second mother board is disposed on the second side of the second mother board, and the first connector included on the fourth mother board is disposed on a first side of the fourth mother board that is proximate to the second side of the second mother board, and wherein the second connector included on the second mother board and the first connector included on the fourth mother board are substantially aligned with one another.

16. The system as recited in claim 10, wherein the power distribution board included in the power supply unit is configured to distribute power substantially equally between the first mother board and the second mother board.

17. The system as recited in claim 16, further comprising a backup power supply that is connected to the power distribution board, wherein the power distribution board is configured to distribute power from the backup power supply to the first mother board and to the second mother board when the power supply unit stops working.

18. The system as recited in claim 10, wherein the enclosed computing system comprises a chassis.

19. A system, comprising:
- a first mother board that is connected to a power distribution board included in a power supply unit via a first short cable, wherein the first mother board is disposed immediately adjacent to a first side of the power supply unit, and wherein the first short cable is configured to transfer power at different voltage levels as well as control signals from the power supply unit to the first mother board; and
- a second mother board that is connected to the power distribution board via a second short cable, wherein the second mother board is disposed immediately adjacent to a second side of the power supply unit that is opposite to the first side of the power supply unit, and wherein the second short cable is configured to transfer power at different voltage levels as well as control signals from the power supply unit to the second mother board.

* * * * *